United States Patent
Schuberth

(10) Patent No.: US 11,543,438 B2
(45) Date of Patent: Jan. 3, 2023

(54) MONOLITHIC GLASS RING AND METHOD FOR OPTICAL CURRENT MEASUREMENTS

(71) Applicant: SIEMENS ENERGY GLOBAL GMBH & CO. KG, Munich (DE)

(72) Inventor: Stefan Schuberth, Lichtenfels (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 28 days.

(21) Appl. No.: 17/280,338

(22) PCT Filed: Sep. 6, 2019

(86) PCT No.: PCT/EP2019/073808
§ 371 (c)(1),
(2) Date: Mar. 26, 2021

(87) PCT Pub. No.: WO2020/064301
PCT Pub. Date: Apr. 2, 2020

(65) Prior Publication Data
US 2022/0034945 A1    Feb. 3, 2022

(30) Foreign Application Priority Data

Sep. 26, 2018 (DE) .................. 102018216482.7

(51) Int. Cl.
*G02F 1/01* (2006.01)
*G01R 15/24* (2006.01)
*G01R 19/00* (2006.01)

(52) U.S. Cl.
CPC ....... *G01R 15/246* (2013.01); *G01R 19/0092* (2013.01); *G02F 1/0136* (2013.01); *G02F 2202/09* (2013.01)

(58) Field of Classification Search
CPC ................ G01R 15/246; G01R 15/247; G01R 19/0092; G02F 1/0136; G02B 6/00
See application file for complete search history.

(56) References Cited

U.S. PATENT DOCUMENTS 4,564,754 A * 1/1986 Sato ...................... G01R 15/246
250/225
4,745,357 A * 5/1988 Miller ...................... G02F 1/09
324/96

(Continued)

FOREIGN PATENT DOCUMENTS

AU    1207788 A    9/1988
DE    4342409 A1    6/1995

(Continued)

OTHER PUBLICATIONS

Yoshino T et al: Single Glass Block Faraday Effect Current Sensor With Homoegeneous Isotropic Closed Optical Circuit, Applied Optics, Optical Society of America, Washington, DC; US, vol. 36, No. 22, pp. 5566-5573, XP000720879, ISSN: 0003-6935, DOI: 10.1364/AO.36.005566; Abstract; Figure 1; 1997.

(Continued)

*Primary Examiner* — Dominic E Hawkins
(74) *Attorney, Agent, or Firm* — Laurence A. Greenberg; Werner H. Stemer; Ralph E. Locher

(57) ABSTRACT

A glass ring for current measurements includes a glass body, which can be disposed around an electrical conductor and has a light entry surface and a light exit surface. The glass ring allows light which enters the glass body through the light entry surface to circulate completely around the conductor in the glass body by reflection on external sides or outer faces of the glass body, the light exiting from the glass body on the light exit surface. The glass ring is formed of a monolithic glass body. A method for optical current measurement includes using a current flow in an electrical conductor to generate an electromagnetic field around the conductor, by which a polarization of a light beam in the glass ring around the conductor, in particular with a plane (Continued)

perpendicular to the longitudinal axis of the conductor, is changed as the light beam circulates around the conductor.

13 Claims, 1 Drawing Sheet

(56) References Cited

U.S. PATENT DOCUMENTS

| | | | |
|---|---|---|---|
| 5,304,920 A | | 4/1994 | Stierlin |
| 5,583,428 A | | 12/1996 | Meier et al. |
| 5,780,845 A | * | 7/1998 | Koide ............... G01R 15/246 |
| | | | 250/225 |
| 5,834,933 A | | 11/1998 | Meier |
| 5,844,409 A | | 12/1998 | Bosselmann et al. |
| 5,847,560 A | | 12/1998 | Bosselmann et al. |
| 5,933,000 A | * | 8/1999 | Bosselmann ...... G01R 33/0322 |
| | | | 250/225 |
| 9,465,053 B2 | | 10/2016 | Konno et al. |

FOREIGN PATENT DOCUMENTS

| | | |
|---|---|---|
| DE | 4342410 A1 | 6/1995 |
| DE | 4432146 A1 | 3/1996 |
| DE | 4443948 A1 | 6/1996 |
| DE | 4446425 A1 | 6/1996 |
| EP | 0088419 A1 | 9/1983 |
| RU | 2569912 C2 | 12/2015 |
| WO | WO9400768 A1 | 1/1994 |

OTHER PUBLICATIONS

Ning Y N et al: "Miniature Faraday Current Sensor Based on Multiple Critical Angle Reflections in a Bulk-Optic Ring", Optics Letters, Optical Society of America, US, vol. 16, No. 24, pp. 1996-1998, XP000244022, ISSN: 0146-9592; Abstract; Figure 1; 1991.

Ning Y N et al: "A Faraday current sensor using a novel multi-optical-loop sensing element", Measurement Science and Technology, IOP, Bristol, GB, vol. 6, No. 9, pp. 1339-1342, XP020066026, ISSN: 0957-0233, DOI: 10.1088/0957-0233/6/9/014; Abstract Figures 1,2; 1995.

* cited by examiner

MONOLITHIC GLASS RING AND METHOD FOR OPTICAL CURRENT MEASUREMENTS

BACKGROUND OF THE INVENTION

Field of the Invention

The invention relates to a glass ring for current measurements and to a method for optically measuring current, having a glass body that is arrangeable around an electrical conductor and has a light entry surface and a light exit surface. The glass ring is configured to allow light entering the glass body through the light entry surface to completely circulate around the conductor in the glass body due to reflection at external sides of the glass body, wherein the light exits the glass body at the light exit surface.

An electric current is measured for example resistively via a voltage drop at a resistor. An alternating current generates an electromagnetic field around a current-carrying conductor, which can be measured inductively for example by a measurement transformer and/or optically with the aid of the Faraday effect. High currents, in particular in the range of a few hundred amperes, can be advantageously measured by induction and/or by the Faraday effect because these methods do not increase the resistance in current-carrying conductors or primary conductors. For measuring current with the Faraday effect, polarized light is guided around a current-carrying conductor. For this purpose, polarization-maintaining optical waveguides or for example a glass ring are used. In this case, glass with a Verdet constant that is not equal to zero is used.

The magnetic field of the current-carrying conductor in the glass results in an additional rotation of the polarization plane of the incident light, which can be measured by various methods and is directly proportional to the current in the conductor. Glass rings that are used exhibit significantly lower temperature and vibration effects than optical waveguides but are not yet producible without adhesively bonding glass. Such glass rings are known for example from U.S. Pat. No. 4,564,754. A glass ring that is used comprises four corners and has substantially a rectangular shape. In each of the four corners of the rectangular glass ring, the light beam is reflected via two surfaces that are tilted to one another by 90 degrees so as not to change the polarization plane. The glass ring geometry is thereby partially fixed. A second boundary condition is the possibilities of a grinding and polishing process during the production of such a glass ring. In this case, only continuous surfaces without shoulders can be polished in each case.

The boundary conditions result in the glass ring that is producible in this way not allowing a 360-degree circulation of light around the conductor or in light not being able to be coupled in or out. The production of such glass rings that do allow the coupling of light in and out and a 360-degree circulation of light around the conductor requires assembly of the polarization-maintaining glass ring from multiple parts. The parts are assembled and adhesively bonded. In this way, limitations imposed by the polishing process can be circumvented. In order to not induce any mechanical stresses into a glass body of the glass ring through the adhesion points, which results in stress birefringence and polarization effects, the glass adhesive systems in this case requires very long hardening times. The adhesives that are used are usable only in specific application temperature ranges. If the temperature range is exceeded, the mechanical parameters change. The adhesive may degrade and exhibit color changes, resulting in measurement value drifts and measurement deviations that are not acceptable in an optical measurement system.

The areas of use of an adhesively bonded glass ring, assembled from a plurality of monolithic glass bodies, are therefore limited. The use for measuring current is possible only to a limited extent because the degradation and/or color change of the adhesive and/or mechanical stresses do not permit a measurement system that is stable in the long term. Measurements with an adhesively bonded glass ring result in measurement errors in particular after calibration, which increase over time. The adhesive additionally results in mechanical problems, in particular at temperatures outside a permissible temperature range. The production of adhesively bonded glass rings is complex, time-consuming, and costly.

SUMMARY OF THE INVENTION

It is the object of the present invention to specify a glass ring for current measurements and a method for optically measuring current, which achieve the above-described problems. It is in particular the object to specify a glass ring that is producible with a long-term stability, in a simple manner and cheaply, with the glass ring resulting in no or low measurement errors during optical current measurements and being mechanically stable, in particular in a broad temperature range and over long time periods.

The specified object is achieved according to the invention by a glass ring for current measurements having the features described below and/or by a method for optically measuring current, in particular having a previously described glass ring, having the steps described below. Advantageous refinements of the glass ring according to the invention for current measurements and/or of the method for optically measuring current, in particular with a previously described glass ring, are specified in the dependent claims. Subject matters of the main claims are here combinable among one another and with features of dependent claims, and features of the dependent claims are combinable among one another.

A glass ring according to the invention for current measurements comprises a glass body that is arrangeable around an electrical conductor and has a light entry surface and a light exit surface. The glass ring is configured to allow light entering the glass body through the light entry surface to completely circulate around the conductor in the glass body due to reflection at external sides of the glass body, wherein the light exits the glass body at the light exit surface. The glass ring is formed according to the invention from a monolithic glass body.

Due to the glass ring being formed from a monolithic glass body, without adhesive bonding, an optical change in the light due to an adhesive is ruled out. Aging effects of an adhesive on light in the glass ring are ruled out and temperature effects on the stability of the glass ring, for example by critically changing the mechanical stability at temperatures outside a prescribed temperature range, do not occur. The optical behavior of the glass ring that is monolithic according to the invention is stable over the long term, and such a glass ring, which is polarization-maintaining for light and allows coupling of light in and out and a 360-degree circulation for light around an electrical conductor is producible with mechanical stability in a simple manner and without much complexity in particular by polishing side surfaces.

The glass ring can comprise two mutually opposite sides, in particular a fifth and a sixth side. In particular, these may comprise two parallel, planar, mutually opposite sides, each having exactly four corners. The glass ring can have a circular cylindrical through-opening, which extends in particular through the two sides. An electrical conductor can be guided through the opening, in particular arranged with a longitudinal axis perpendicular to the two parallel, planar, mutually opposite sides. This allows a current measurement of the current in the electrical conductor via the electromagnetic field of the conductor that projects into the glass ring. A change in the polarization of light in the glass ring takes place in dependence on the electromagnetic field and thus in dependence on the current strength in the conductor, in particular proportionally.

The glass ring can be formed such that, when light circulates around the conductor, the polarization of the light is substantially completely maintained. In this way, the measurement of the current in the conductor becomes possible because a change in the polarization of the light takes place not due to the glass ring itself, but only due to electromagnetic fields of the conductor. A circulation of light around the conductor allows sufficient interaction of the light with the electromagnetic field of the current-carrying conductor such that a measurable polarization change of the light can take place due to the electromagnetic field of the current-carrying conductor. In this way, the measurement of the current strength in the conductor with the aid of the glass ring becomes possible.

The light entry surface can be a third side of the glass ring, which third side comprises two mutually adjacent partial surfaces that are tilted through an angle with respect to one another, wherein a partial surface has in particular a triangular shape. The partial surface that is mounted obliquely or is tilted through an angle and in particular has a triangular shape makes it possible that there is a sufficiently large surface for the light entry and/or light exit, and therefore coupling light into and out of the glass ring is possible.

In particular adjacent to the third side of the glass ring, a second side comprising, adjacent to the sixth side, a first, in particular trapezoidal planar partial surface, can be arranged. The second side can comprise, adjacent to the fifth side, a trapezoidal partial surface that is composed of two in particular triangular surfaces that are tilted with respect to one another, i.e. a second and a third partial surface of the second side. The tilting of the in particular triangular surfaces, the second and third partial surfaces of the second side, repositions a light beam such that it leaves the glass ring at the light exit surface. In this way, light can exit the glass ring and a measurement outside the glass ring of the polarization change of the light in the glass ring due to the electromagnetic field of the current-carrying conductor is possible with the above-described advantages.

The third partial surface of the second side can be tilted through an angle of a few degrees, in particular 2 degrees, with respect to the second partial surface of the second side. Tilting through only a few degrees, in particular through 2 degrees, results in the above-described advantages.

In particular adjacent to the second side, a fourth side, which is constructed from two mutually adjacent partial surfaces that are tilted with respect to one another, with each partial surface having in particular a trapezoidal shape, can be comprised. A light beam is reflected by the partial surfaces, in particular one partial surface, during a circulation in the glass ring in the direction of the fifth side or onto a first partial surface of the first side. In this way, a closed circulation without polarization change due to the glass ring or the glass body itself is made possible, having the above-described advantages.

In particular adjacent to the third side, a first side, which is constructed of two mutually adjacent partial surfaces that are tilted with respect to one another, with each partial surface being embodied to be in particular trapezoidal, can be comprised. A light beam is reflected by the partial surfaces, in particular one partial surface, during a circulation in the glass ring in the direction of the second side or onto a first partial surface of the second side. A closed circulation without polarization change due to the glass ring or the glass body itself is thus made possible, having the above-described advantages.

The glass body can comprise a glass having a Verdet constant that is greater or smaller than zero and/or consist of a glass having a Verdet constant that is greater or smaller than zero. The Verdet constant here represents a material property that indicates the strength of the Faraday effect in a specific material or substance. The value depends on the wavelength of the light and is positive for a substance or material, that is to say in particular for glass, that has a left-rotating effect in the case of light that propagates parallel to the magnetic field lines. Owing to a Verdet constant of the glass from which the glass body or the glass ring consist not being equal to zero, an electromagnetic field acts on the light and changes the polarization of the light in dependence on the magnitude of the field or in dependence on the current in the current-carrying conductor. Since the glass does not or not substantially change the polarization of the light in the glass ring in the absence of an electromagnetic field, a current in the current-carrying conductor can be measured or determined via the change in the polarization in the glass ring.

A method according to the invention for optically measuring current, in particular with an above-described glass ring, comprises that a flow of current in an electrical conductor generates an electromagnetic field around the conductor, via which the polarization of a light beam in a glass ring, which is arranged around the conductor, in particular with a plane perpendicular to the longitudinal axis of the conductor, is changed during a circulation of the light beam around the conductor.

During a circulation around the conductor, the light beam can travel through a monolithic glass body, wherein changes in directions of the light beam are realized via reflection at external sides of the glass body, in particular at a third partial surface of the second side that is tilted, in particular through an angle of 2 degrees, with respect to a second partial surface of the second side and/or at a partial surface, in particular in the shape of a triangle, of the third side of the glass ring that is tilted through a few degrees. The partial surface of the third side of the glass ring, in particular in the shape of a triangle, that is tilted through a few degrees makes it possible with the other partial surface of the third side that there is a sufficiently large surface for the light entry and, in combination with the sixth side, that there is a sufficiently large surface for the light exit from the glass ring in order to couple light into and out of the glass ring. The third partial surface of the second side, which is tilted, in particular tilted through an angle of 2 degrees, with respect to the second partial surface of the second side, makes possible the light exit at a light exit surface, which comprises in particular parts of the sixth side, adjacent to the light entry at the third side in particular by repositioning the light beam in the glass ring.

Owing to the above-described tilted surfaces, which can be produced simply and cost-effectively by cutting, grinding and/or polishing the glass body or the glass ring, a high-temperature-resistant optical measurement device for large currents is producible, which is stable over the long term and without signs of aging such as a change in the transmission and/or coloration due to components in the beam path of the light.

The light can enter the glass body through the light entry surface and exit the glass body at the light exit surface. The light can enter the glass body in particular via the third side of the glass ring, in particular via two adjacent partial surfaces that are tilted through an angle with respect to one another, and/or exit the glass body on the sixth side of the glass ring, in particular at an angle of substantially 90 degree relative to the entering light.

The advantages of the method according to the invention for optical current measurement, in particular with an above-described glass ring, are similar to the above-described advantages of the glass ring according to the invention for measuring currents, and vice versa.

An exemplary embodiment of the invention will be illustrated schematically below in FIGS. 1 and 2 and described in more detail below.

DETAILED DESCRIPTION OF THE INVENTION

Figure 1:
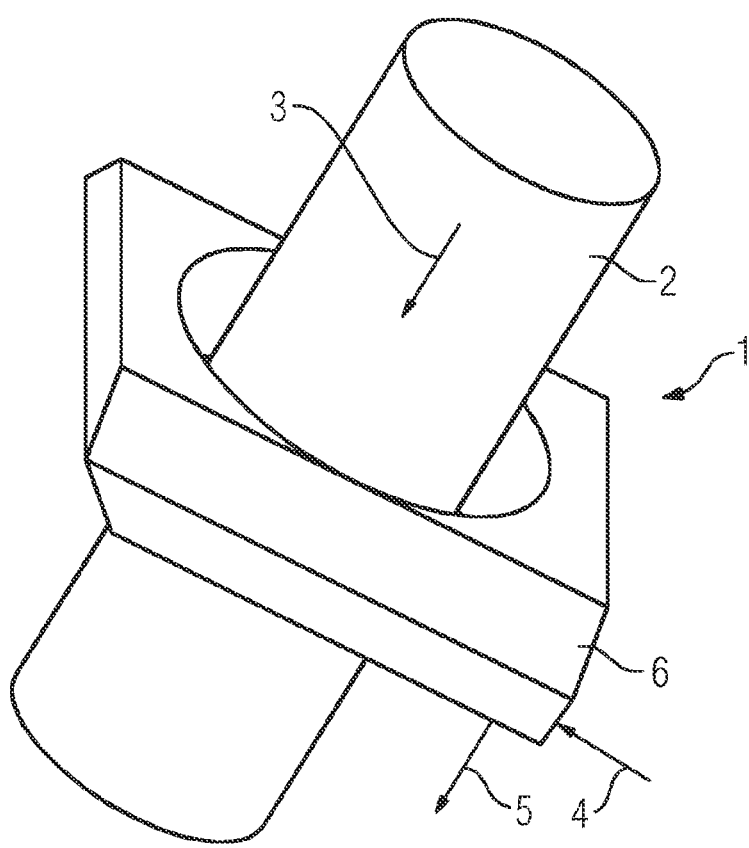
FIG. 1 schematically shows an oblique view of an arrangement for optically measuring a current 3 in an electrical conductor 2 with the aid of a glass ring 1 according to the invention, and FIG. 2 schematically illustrates the shape or geometry of the glass ring 1 of FIG. 1.

FIG. 1 schematically illustrates an oblique view of an arrangement for optically measuring a current 3, in particular in the range of up to a few hundred amperes, in an electrical conductor 2 with the aid of a glass ring 1 according to the invention. The electrical conductor 2, for example a copper conductor and/or cable, is for example cylindrical. A current 3 flows in the direction of the arrow in FIG. 1. A glass ring 1 is arranged around the conductor 2, circulates around the conductor 2 completely. The glass ring 1 is arranged with a plane, in particular a parallel upper and lower side according to FIG. 1, perpendicularly to the longitudinal axis of the cylindrical conductor 2. The glass ring 1, with its substantially rectangular base and top surface or in particular parallel upper and lower side, has centrally a circular cylindrical through-opening, through which the conductor 2 is guided.

The glass ring 2 has six sides, in particular a parallel upper and lower side and in addition four lateral sides according to FIG. 1, wherein the sides delimit the glass body, that is to say the glass material of the glass ring 2, with respect to the outside, that is to say in particular with respect to the ambient air or the ambient gas. The glass or glass material of the glass ring 1 is for example a glass for optical applications, having a little contamination and a Verdet constant that is in particular greater than zero. The glass is high-temperature-resistant, for example.

Light or a light beam 4, in particular light having a specific optical wavelength that is adapted to the glass material and to its refractive index and absorption behavior, which light beam is provided for example via a laser or via a light source with optical components such as lenses, enters the glass ring 1 for example via a lateral side. The light is radiated into the glass ring 1 for example perpendicularly to the longitudinal axis of the conductor 2 or parallel to the parallel upper and lower side of the glass ring 1. The midpoint or the central axis of the light beam is here directed at a region of the light entry side that is adjacent to a corner of the glass ring 1, for example the front bottom right corner in FIG. 1. After reflections at sides or side surfaces of the glass ring 1, wherein the light beam in the glass ring 1 completely circulates once around the conductor 2, the light beam or the light exits at the light exit side, which is the lower side of the glass ring 1 in FIG. 1.

The region in which the light exits the glass ring 1 in the exemplary embodiment of FIG. 1 lies on the lower side that is adjacent to the corner of the glass ring 1 and adjacent to which the light enters at the light entry side. The light entry side and the light exit side are adjacent to one another, at an angle of substantially 90 degrees with respect to one another, wherein the light exit side is a lower side of the glass ring according to FIG. 1 and the light entry side is a lateral side. During the circulation of the light around the current-carrying conductor 2, the light changes its polarization substantially only in dependence on the electromagnetic field of the current 3 in the conductor 2. After calibration, a measurement of the polarization change of the light yields the current strength in the conductor 2 for example in amperes.

Figure 2:
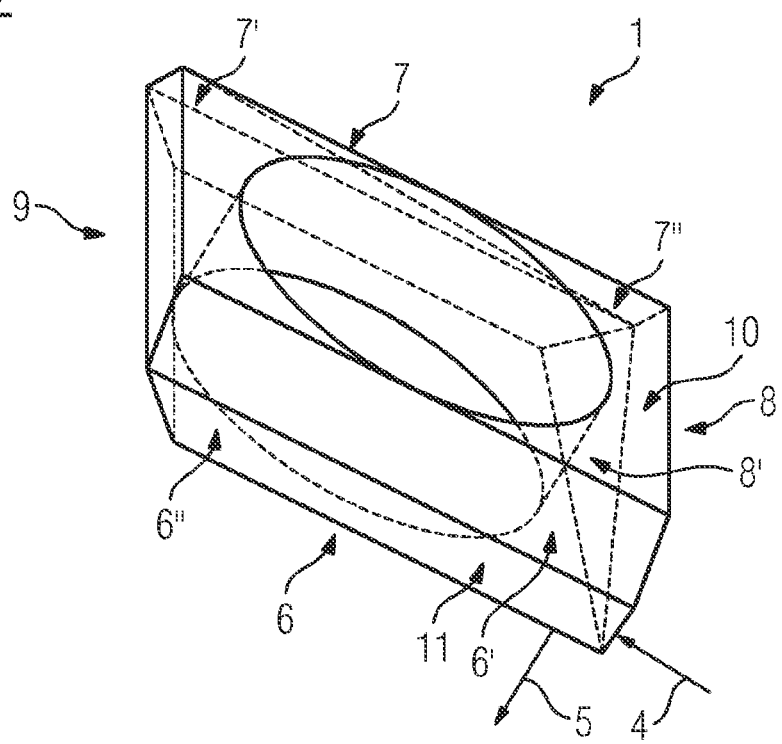

FIG. 2 illustrates the geometry of the glass ring 1 of FIG. 1 with its external delimiting sides in detail. Edges visible when viewed from the viewing angle of FIG. 2, are marked with solid lines, whereas edges that are obscured when viewed from the viewing angle of FIG. 2 are marked with dashed lines. The upper side or the upper delimiting surface of the glass ring 1 according to FIG. 2 is referred to as the fifth side 10. The lower side or the lower delimiting surface of the glass ring 1 according to FIG. 2 is referred to as the sixth side 11. The fifth and sixth sides 10, 11 are arranged parallel to one another and are planar. The two sides 10 and 11 are penetrated centrally by the circular cylindrical through-opening, that is to say they have circular holes, through which the conductor 2 is guided, which is not illustrated in FIG. 2 for the sake of simplicity.

Laterally of the glass ring 1, four sides, the first side 6, the second side 7, the third side 8, and the fourth side 9, terminate the glass ring 1, wherein in each case two sides 6 and 7 and also 8 and 9 lie opposite one another. The third side 8 is the light entry side. The third side 8 has two partial surfaces, wherein the first partial surface 8' of the third side 8 has the shape of a triangle. One edge of the triangle is a common edge with the sixth side 11, and a further edge is a common edge with the second side 7. By dividing the third side 8 into two partial surfaces, for example produced from one surface by grinding, light can be coupled into the glass ring 1 on the third side 8 with sufficient intensity and be coupled out on the sixth side 11. The two partial surfaces of the third side 8 are connected to one another via a common, in particular straight, edge and enclose an obtuse angle.

The fourth side 9, which is constructed from two in particular trapezoidal partial surfaces, is located opposite the third side 8. The two partial surfaces of the fourth side are connected to one another by a common, in particular straight, edge and enclose an obtuse angle. One partial surface, the partial surface that is the upper partial surface in FIG. 2, forms a hip-roof-type construction with the second partial surface, the partial surface that is the lower partial surface in FIG. 2. The upper partial surface is arranged for example at a right angle with respect to the fifth side 10, and the lower partial surface is produced from the surface for example by oblique grinding.

The first side 6 is constructed similarly to the fourth side 9, except with partial surfaces being arranged the other way round. The two partial surfaces of the first side are connected to one another by a common, in particular straight, edge and enclose an obtuse angle. A partial surface 6', the partial surface that is the upper partial surface in FIG. 2, forms a hip-roof-type construction with the second partial surface 6'', the partial surface that is the lower partial surface in FIG. 2. The lower partial surface 6'' is arranged for example at a right angle with respect to the sixth side 11, and the upper partial surface 6' is produced from the surface for example by oblique grinding.

The second side 7 is constructed similarly to the first side 6, except with a partial surface that is the upper partial surface in FIG. 2 and is subdivided further into two partial surfaces 7' and 7''. The lower partial surface in FIG. 2 is arranged for example at a right angle with respect to the sixth side 11, and the upper partial surfaces 7' and 7'' are produced from the surface by oblique grinding. The two upper partial surfaces 7' and 7'' are in each case triangular and have a common edge. A repositioning of the light beam during circulation through the glass ring 1 takes place owing to the partial surface 7'', as a result of which the light beam, after reflection at the partial surface 6', can exit the glass ring 1 in particular perpendicularly to the sixth side 11.

The light beam thus enters the glass ring 1 on the third side 8, adjacent to the front lower corner in FIG. 2, via both partial surfaces of the third side 8, is reflected to the first partial surface 6' of the first side 6 at the partial surface of the fourth side 9 that is the lower partial surface in FIG. 2, the light beam is reflected here to the first partial surface 7' of the second side 7, and reflected further to the partial surface of the fourth side 9 that is the lower partial surface in FIG. 2. From the partial surface of the fourth side 9 that is the lower partial surface in FIG. 2, the light beam is reflected to the first partial surface 8' of the third side 8, and, from here, further to the second partial surface 7'' of the second side 7, wherein reflection to and then at the first partial surface 6' of the first side 6 to the sixth side 11 results in the light beam exiting the glass ring 1 via the sixth side 11. In the process, the light beam has completely circulated around the conductor 2 once and has substantially maintained its polarization due to reflection at the glass sides. Changes in the polarization that have taken place are in particular due only to the electromagnetic field of the conductor 2 in the glass ring 1 during the flow of current 3 in the conductor 2. The value of the flow of current 3 can in this way be determined via measurements of the degree of the change in polarization.

The previously described exemplary embodiments can be combined with one another and/or can be combined with the prior art. For example, glasses with a positive or with a negative Verdet constant can be used for the glass ring 1. The glass ring 1 can be produced from a cuboid body, which is produced by a glass cut, by way of grinding. Alternatively or in addition, in particular beveled and/or tilted surfaces can be produced directly by glass cutting or by polishing. The through-opening in the glass ring 1 can be circular cylindrical or for example square, T-shaped, or double-T-shaped, for example depending on the shape of the conductor 2 in particular in the case of rail-type conductors 2. The glass of the glass ring 1 or the glass body can be made for example of a Corning glass or comprise other optical glasses. Apparatuses for generating light, in particular light having one wavelength, which are not illustrated in the figures for the sake of simplicity, can comprise lasers and/or lamps having lenses and/or polarization filters. Apparatuses for analyzing the light, in particular for light having one wavelength with a changed polarization, which are not illustrated either in the figures for the sake of simplicity, can comprise polarization filters, lenses and/or interferometers.

The glass ring 1 can be produced from a cube, which is produced in particular by glass cutting. The beveled partial surfaces, in particular ground or angled at angles of 135 degrees with respect to the respectively associated cube surface or by 45 degrees, for example the partial surfaces 6', 7' and the lower partial surface according to FIG. 2 of the fourth side 9, are producible for example by glass cutting and/or glass grinding. The partial surface 7'', which is angled in particular by 2 degrees with respect to the partial surface 7', is producible for example by grinding and/or by polishing. The partial surface 8' is likewise producible by cutting and/or grinding, wherein all surfaces can be polished to a finish. Further processing methods for the glass ring 1 can comprise drilling, milling, and/or laser processing, for example.

LIST OF REFERENCES

1 Glass ring
2 Electrical conductor
3 Direction flow of current
4 Light entry surface
5 Light exit surface
6 First side, front delimiting surface
6' First partial surface of the first side, upper front delimiting surface
6'' Second partial surface of the first side, lower front delimiting surface
7 Second side, rear delimiting surface
7' Second partial surface of the second side, first upper rear delimiting surface
7'' Third partial surface of the second side, second upper rear delimiting surface
8 Third side, right lateral delimiting surface
8' First partial surface of the third side, right lower lateral delimiting surface
9 Fourth side, left lateral delimiting surface
10 Fifth side, upper delimiting surface
11 Sixth side, lower delimiting surface

The invention claimed is:

1. A glass ring for current measurements, the glass ring comprising:
   a monolithic glass body configured to be disposed around an electrical conductor, said glass body having a light entry surface, a light exit surface and external sides;
   said glass body configured to allow light entering said glass body through said light entry surface to completely circulate around the conductor in said glass body due to reflection at said external sides of said glass body and to allow the light to exit said glass body at said light exit surface;
   said glass body including at least one of two mutually opposite sides each having exactly four corners, or a circular cylindrical through-opening;
   said glass body including first, second, third and fourth sides, and said two mutually opposite sides being fifth and sixth parallel planar sides, or said circular cylindrical through-opening extending through said two mutually opposite sides;

said light entry surface being said third side of said glass body, said third side including two adjacent partial surfaces being tilted about an angle relative one another, and said third side including a partial surface; and said glass body including at least one of a first planar partial surface of said second side being adjacent to said sixth side, or a trapezoidal partial surface disposed adjacent to said fifth side and formed of two surfaces being tilted relative to one another.

2. The glass ring according to claim 1, wherein said glass body is configured to substantially completely maintain a polarization of the light upon a circulation of light around the conductor without any flow of current.

3. The glass ring according to claim 1, wherein said partial surface has a triangular shape.

4. The glass ring according to claim 1, wherein:
said second side is adjacent to said third side,
said first planar partial surface has a trapezoidal shape,
said trapezoidal partial surface is formed of two triangular surfaces, and
said two surfaces being tilted relative to one another are a second and a third partial surface of said second side.

5. The glass ring according to claim 4, wherein said third partial surface of said second side is tilted about an angle relative to said second partial surface of said second side.

6. The glass ring according to claim 5, wherein said angle about which said third partial surface of said second side is tilted relative to said second partial surface of said second side is 2 degrees.

7. The glass ring according to claim 1, wherein said glass body at least one of:
includes a glass having a Verdet constant being greater or smaller than zero, or is formed of a glass having a Verdet constant being greater or smaller than zero.

8. A glass ring for current measurements, the glass ring comprising:
a monolithic glass body configured to be disposed around an electrical conductor, said glass body having a light entry surface, a light exit surface and external sides;
said glass body configured to allow light entering said glass body through said light entry surface to completely circulate around the conductor in said glass body due to reflection at said external sides of said the glass body and to allow the light to exit said glass body at said light exit surface;
said glass body including at least one of two mutually opposite sides each having exactly four corners, or a circular cylindrical through-opening;
said glass body including first, second, third and fourth sides, and said two mutually opposite sides being fifth and sixth parallel planar sides, or said circular cylindrical through-opening extending through said two mutually opposite sides;
said fourth side being constructed of two mutually adjacent partial surfaces being tilted relative to one another; and
said fourth side being adjacent to said second side, and each partial surface of said fourth side having a trapezoidal shape.

9. A glass ring for current measurements, the glass ring comprising:
a monolithic glass body configured to be disposed around an electrical conductor, said glass body having a light entry surface, a light exit surface and external sides;
said glass body configured to allow light entering said glass body through said light entry surface to completely circulate around the conductor in said glass body due to reflection at said external sides of said the glass body and to allow the light to exit said glass body at said light exit surface;
said glass body including at least one of two mutually opposite sides each having exactly four corners, or a circular cylindrical through-opening;
said glass body including first, second, third and fourth sides, and said two mutually opposite sides being fifth and sixth parallel planar sides, or said circular cylindrical through-opening extending through said two mutually opposite sides;
said first side being constructed of two mutually adjacent partial surfaces being tilted relative to one another; and
said first side being adjacent to said third side, and each partial surface of said first side being trapezoidal.

10. A method for optically measuring currents, the method comprising:
providing a glass ring including a monolithic glass body configured to be disposed around an electrical conductor, the glass body having a light entry surface, a light exit surface and external sides, the glass body configured to allow light entering the glass body through the light entry surface to completely circulate around the conductor in the glass body due to reflection at the external sides of the glass body and to allow the light to exit the glass body at the light exit surface;
using a flow of current in the electrical conductor to generate an electromagnetic field around the conductor, for changing a polarization of a light beam in the glass ring disposed around the conductor during a circulation of the light beam around the conductor;
during the circulation around the conductor, causing the light beam to travel through the monolithic glass body, and changing directions of the light beam by reflection at external sides of the glass body;
providing the monolithic glass body with first, second, third and fourth sides; and
carrying out the change in directions of the light beam by reflection at least one of:
at a third partial surface of the second side being tilted about an angle of 2 degrees relative to a second partial surface of the second side, or
at a tilted triangular partial surface of the third side.

11. The method according to claim 10, which further comprises orienting the glass ring in a plane perpendicular to a longitudinal axis of the conductor.

12. The method according to claim 10, which further comprises:
providing the monolithic glass body with fifth and sixth sides; and
causing the light to at least one of:
enter the glass body through the light entry surface and exit the glass body through the light exit surface, or
enter the glass body through at least one of the third side or two adjacent partial surfaces tilted relative to one another, or
exit the glass body through the sixth side.

13. The method according to claim 12, which further comprises causing the light to exit the glass body through the sixth side at an angle of substantially 90 degrees relative to the entering light.

* * * * *